United States Patent [19]
Rhoades et al.

[11] Patent Number: 5,269,879
[45] Date of Patent: Dec. 14, 1993

[54] METHOD OF ETCHING VIAS WITHOUT SPUTTERING OF UNDERLYING ELECTRICALLY CONDUCTIVE LAYER

[75] Inventors: Paul Rhoades, Mountainview; Mark Halman, Oakland; David Kerr, Santa Clara, all of Calif.

[73] Assignee: Lam Research Corporation, Fremont, Calif.

[21] Appl. No.: 777,611

[22] Filed: Oct. 16, 1991

[51] Int. Cl.$^5$ .................................... H01L 21/00
[52] U.S. Cl. ................... 156/643; 156/646; 156/657; 156/662
[58] Field of Search ................ 156/643, 646, 657, 662

[56] References Cited
U.S. PATENT DOCUMENTS

| | | |
|---|---|---|
| 4,407,850 | 10/1983 | Bruce et al. . |
| 4,473,436 | 9/1984 | Beinvogl . |
| 4,617,079 | 10/1986 | Tracy et al. . |
| 4,784,720 | 11/1988 | Douglas .............................. 156/643 |
| 4,844,773 | 7/1989 | Loewenstein et al. .............. 156/643 |
| 4,908,333 | 3/1990 | Shimokawa et al. ........... 156/646 X |
| 4,948,459 | 8/1990 | Van Laarhoven et al. . |
| 4,948,462 | 8/1990 | Rossen . |
| 4,973,381 | 11/1990 | Palmer . |
| 4,978,420 | 12/1990 | Bach . |
| 4,981,550 | 1/1991 | Huttemann et al. . |
| 5,006,485 | 4/1991 | Villalon .......................... 156/657 X |
| 5,022,958 | 6/1991 | Favreau et al. . |

Primary Examiner—Thi Dang
Attorney, Agent, or Firm—Burns, Doane, Swecker & Mathis

[57] ABSTRACT

A process for etching of silicon oxide/nitride such as silicon dioxide, silicon nitride or oxynitride. The process includes etching a silicon oxide/nitride layer to expose an underlying electrically conductive layer and provide a via extending through the silicon oxide/nitride layer to the electrically conductive layer. The etching is performed by exposing the silicon oxide/nitride layer to an etching gas in an ionized state in a reaction chamber of a plasma generating device. The etching gas includes a fluoride-containing gas and a passivating gas which is present in an amount effective to suppress sputtering of the electrically conductive layer when it is exposed to the etching gas during the etching step. The passivating gas can be nitrogen gas and the fluoride-containing gas can be $CF_4$, $CHF_3$, $C_2F_6$, $CH_2F_2$, $SF_6$, other Freons and mixtures thereof. The etching gas can also include a carrier gas such as Ar, He, Ne, Kr or mixtures thereof. The etching can be reactive ion etching or plasma etching and the etching gas can be exposed to a microwave electric field and/or a magnetic field during the etching step. The etching gas can achieve 350% overetching while preventing sputtering of the electrically conductive layer which can be Al, Al alloys, Ti, TiN, TiW and Mo.

19 Claims, 1 Drawing Sheet

METHOD OF ETCHING VIAS WITHOUT SPUTTERING OF UNDERLYING ELECTRICALLY CONDUCTIVE LAYER

FIELD OF THE INVENTION

The invention relates to an improved plasma etching and reactive ion etching process for opening vias in semiconductor composites.

BACKGROUND OF THE INVENTION

U.S. Pat. No. 4,973,381 ("Palmer") discloses a process for etching a semiconductor surface with excited gas which is drawn out by a pressure differential through an output opening in a glass or quartz container toward a surface to be etched. The container is placed in a vacuum enclosure at a pressure of $10^{-4}$ to $10^{-5}$ Torr. The excited species can be a mixture of $CCl_4$ and $O_2$ or an active species such as fluorine and a buffer gas such as He, Ar or N. In Palmer, plasma ions reunite prior to exiting the container and the etching gas will not be in an ionized state when it contacts the wafer.

U.S. Pat. No. 4,978,420 ("Bach") discloses etching vias in a dual-layer comprising $SiO_2$ and silicon nitride. In Bach, the photoresist and nitride layers are etched simultaneously with an etching gas which includes $CF_4$ or $SF_6$, oxygen and argon and the oxide is etched with the same gases except for the absence of oxygen. The power in the plasma reactor is set at 325-350 Watts during the nitride etch and increased to 375 Watts for the oxide etch. A tungsten layer is provided beneath the oxide to resist overetching since W is highly resistant to the oxide etch.

U.S. Pat. No. 4,981,550 ("Huttemann") discloses a process for etching W by exposing a layer of W and a buffer layer to the etching plasma. Huttemann discloses that the buffered layer can be Al and an inert gas such as Ar can be used to sputter clean the buffer layer simultaneously with the plasma etch.

U.S. Pat. No. 4,948,462 ("Rossen") discloses a process for etching W by exposing a W layer to $SF_6$, $N_2$ and $Cl_2$ etching gases.

U.S. Pat. No. 4,617,079 ("Tracy") discloses plasma etching of $SiO_2$ with 200 sccm Ar, 40 sccm $CF_4$ and 40 sccm $CHF_3$.

U.S. Pat. No. 4,407,850 ("Bruce") discloses anisotropic etching of a photoresist under plasma conditions at pressures above those used in reactive ion etching. In particular, etching at rates of 2000 to 300 Å/min was obtained using pressures of 0.3 to 2 Torr and reactive gases $O_2$ and Ar. The background of Bruce mentions that planarizing of rough surface topography allows better focusing using optics with small depths of field. In Bruce, a silicon wafer is coated with a layer of thermal oxide, a 1 μm layer of resist (planarizing layer), a masking layer (1000 Å $SiO_2$) and a 0.5 μm (5000 Å) layer of photoresist. Bruce discloses that the planarizing layer can be Shipley AZ 1350 photoresist.

In prior art plasma etching and reactive ion etching ("RIE") of silicon oxide a fluorinated gas is used as the etching gas. A problem with this type of etching has been sputtering of metal layers and deposition of an organometallic polymer (a carbon-fluorine based polymer which includes the underlying metal) on sidewalls of vias formed during the etching process. Such deposits of organometallic polymer on the sidewalls of the via and photoresist are difficult to remove.

The above problem is even worse when the semiconductor composite includes multiple layers of metal interconnects since dielectric planarization creates various dielectric thicknesses and the etch time to form the vias is based on the thickest oxide step. As a result, the metal underlying the thinner oxide steps is exposed to the etching gas for a longer time thus producing more sputtering of the metal than the metal underlying the thicker oxide steps.

In etching silicon oxide, the fluorinated gas reacts with the oxide to form volatile silicon difluoride or silicon tetrafluoride and carbon monoxide or carbon dioxide. The sputtered metal, however, is not volatile since it is fluorinated. Accordingly, there exists a need in the art for an etch process which can open vias of various oxide depths without metal redeposition or sputtering.

SUMMARY OF THE INVENTION

The invention provides a process for etching of silicon oxide/nitride by providing a composite comprising an electrically conductive layer and a layer of silicon oxide/nitride and etching the silicon oxide/nitride layer with an etching gas in an ionized state to expose the electrically conductive layer and form a via extending through the silicon oxide/nitride layer to the electrically conductive layer. The etching is performed with an etching gas in a reaction chamber of a plasma generating device, the etching gas including a fluoride-containing gas and a passivating gas, the passivating gas being present in an amount effective to suppress sputtering of the electrically conductive layer. The passivating gas is preferably nitrogen gas and the etching can comprise plasma etching or reactive ion etching. The etching gas can be exposed to a microwave electric field, a magnetic field or both.

According to various aspects of the invention, the silicon oxide/nitride layer can comprise a silicon dioxide layer, a silicon nitride layer or a layer of oxynitride. The electrically conducting layer can comprise multi-level metal layers and the electrically conductive layer can be a metal-containing layer such as Al, Al alloys, Ti, TiN, TiW or Mo. The fluoride-containing gas can comprise $CF_4$, $CHF_3$, $C_2F_6$, $CH_2F_2$, $SF_6$ and/or other Freons and mixtures thereof. The etching gas can also include a carrier gas such as Ar, He, Ne, Kr or mixtures thereof. The etching gas preferably excludes oxygen gas.

The process of the invention can include a step of planarizing the silicon oxide/nitride layer, forming a photoresist layer on the silicon oxide/nitride, patterning the photoresist layer to form a plurality of vias and depositing metal on the etched composite so as to fill the vias.

DETAILED DESCRIPTION OF THE PREFERRED EMBODIMENTS

Figure 1:
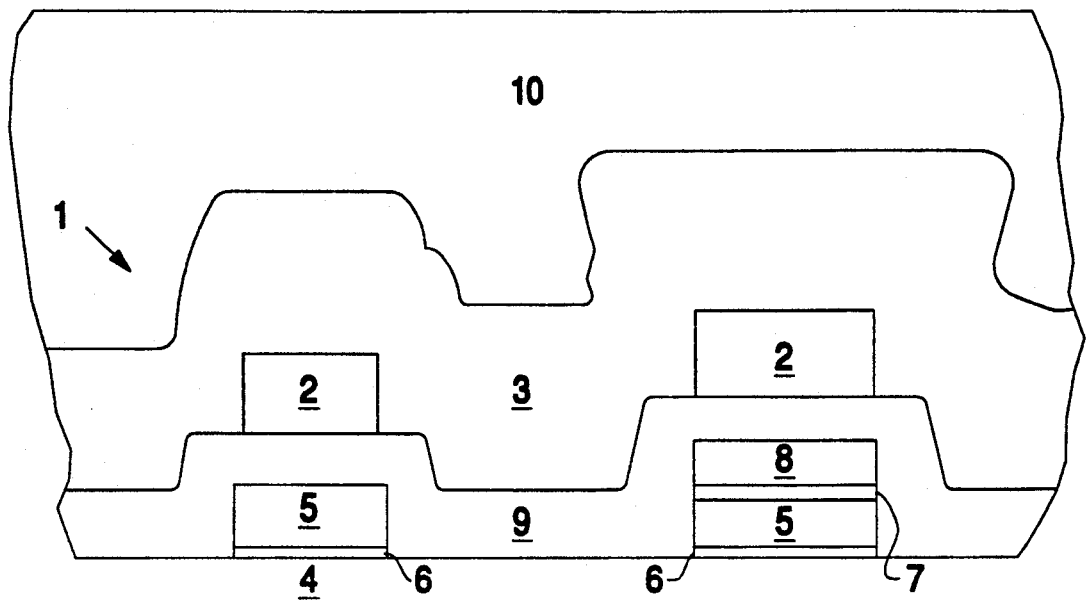
FIG. 1 shows a sectional view of a semiconductor composite which has been processed to include multi-level metallizations.

The invention provides a process which suppresses sputtering of metal during via etching of semiconductor composites.

According to the invention, a process is provided for etching a layer of silicon oxide/nitride in a semiconductor composite. In particular, the semiconductor composite includes an electrically conductive layer underlying the silicon oxide/nitride layer. The etching exposes the electrically conductive layer and provides a via extending through the silicon oxide/nitride layer to the electrically conductive layer. The etching is performed by exposing the silicon oxide/nitride layer to an etching gas in an ionized state in a reaction chamber of a plasma generating device. The etching gas includes a fluoride-containing gas and a passivating gas. The passivating gas is present in an amount effective to suppress sputtering of the electrically conductive layer when it is exposed to the etching gas.

As the packing density of semiconductor devices shrinks and device requirements grow, multiple layers of metal interconnects are becoming more common. The use of dielectric planarization is necessary due to step coverage issues and subsequent metal cracking issues. The introduction of a planarization step, however, creates various dielectric thicknesses within the circuit. Contact to the underlying metal is made by etching holes in the dielectric to the metal, commonly called vias.

When etching the dielectric to form a functional via, an etch time based on the thickest oxide step is necessary. This creates a problem commonly referred to as sputtering, redeposition, crowning or via etch residue. This residue is thought to be a carbon-fluorine based polymer which incorporates the underlying metal into it. This polymer deposits on the sidewalls of the via and photoresist and is very difficult to remove following the via etching step.

Reactive ion etching ("RIE") and plasma etching ("PE") are common methods used to open vias anisotropically through the dielectric to the metal. The basic difference between the two etch modes is pressure. That is, RIE is typically below 50 mTorr and PE is typically above 50 mTorr. The via sputtering problem exists with either mode of etching.

To form vias in silicon oxide/nitride such as silicon dioxide ($SiO_2$) or silicon nitride (SiN) or oxynitride (SiNO), a fluorinated gas such as $CF_4$, $CHF_3$, $CH_2F_2$, $CH_3F$, $C_2F_6$, $SF_6$, $C_nF_{n+4}$ or other Freon and mixtures thereof is used in the plasma reactor. The fluorinated gas dissociates and reacts with the silicon oxide/nitride to form volatile silicon difluoride or silicon tetrafluoride and carbon monoxide or carbon dioxide. A carrier gas such as He, Ne, Ar and Kr may be added to improve the etch rate of the silicon oxide/nitride by providing additional ion bombardment energy to break the strong silicon-oxygen/nitrogen bond. The energy needed to break the silicon-oxygen bond is on the order of 200 kcal/mole. The underlying material also experiences this ionic impact. The underlying material can sputter or react depending on its composition. In the case of via etching, the underlying metal sputters and deposits on the side walls of the silicon oxide/nitride and photoresist. The sputtered metal is not volatile because it is fluorinated. The invention overcomes this problem by adding a passivating gas to the etching gas.

According to the process of the invention, vias of various depths on the circuit can be opened while suppressing metal redeposition or sputtering. In particular, the passivating gas comprises nitrogen. The nitrogen passivates the underlying aluminum, aluminum alloy (such as Al-Si, Al-Si-Cu, Al-Cu, etc.) titanium, titanium nitride, titanium tungsten or molybdenum electrically conducting layers. It is believed that the nitrogen may combine with the metal to form volatile TiN, AlN, etc. rather than a non-volatile organometallic-polymer. It is also believed that the nitrogen reacts with carbon in the feed gas to free up F and thereby increase the etch rate. The etching gas of the invention allows overetching on the order of 200% or even 350% to be achieved without deleterious redeposition or sputtering of the underlying metal on the side wall of the vias or on the resist.

FIG. 1 shows a semiconductor composite according to an exemplary embodiment of the invention prior to a planarization step. In particular, the composite 1 includes an electrically conductive layer 2 and a layer of silicon oxide/nitride 3 on a substrate 4. A layer of previously etched polysilicon 5 on gate oxide 6 is provided to detail topology and a silicide 7 and another layer of polysilicon 8 is patterned on a portion of the polysilicon 5. It should be noted, however, that the topology can be defined in other ways such as by LOCOS oxidation. A layer of silicon dioxide 9 is provided between the electrically conductive layer 2 and the layers of polysilicon 5 and 8. The silicon oxide/nitride layer 3 is provided above the electrically conductive layer 2 and above the exposed portions of the silicon dioxide layer 9. A sacrificial layer 10 is provided above the silicon oxide/nitride layer 3.

Figure 2:
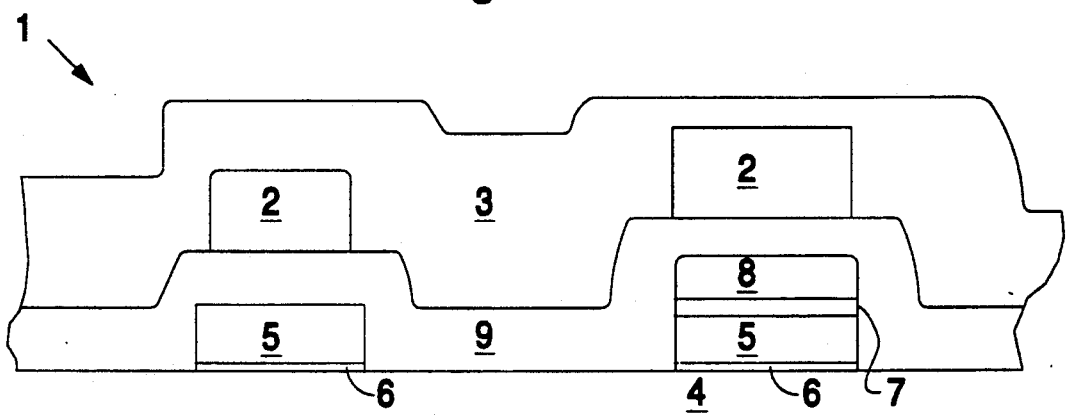
FIG. 2 shows a sectional view of the semiconductor composite of FIG. 1 after a planarization step.

FIG. 2 shows the composite 1 after an oxide planarization step wherein the sacrificial layer 10 is removed and the silicon oxide/nitride layer 3 has been planarized. As shown in FIG. 2, the silicon oxide/nitride layer 3 is thinner above one region of the electrically conductive layer 2 than above a second region of the electrically conductive layer 2.

Figure 3:
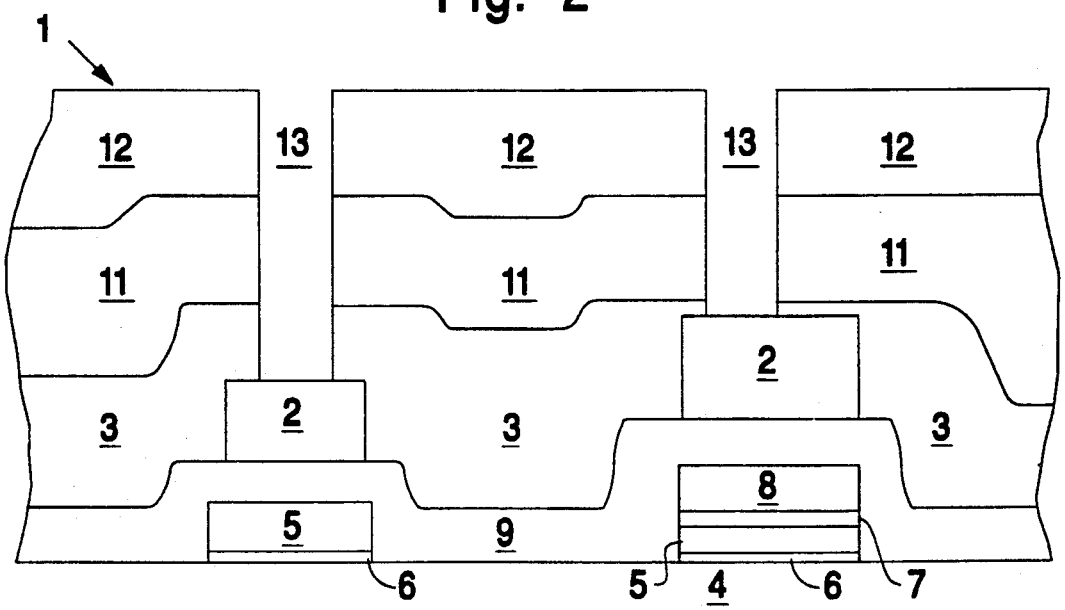
FIG. 3 shows a sectional view of the semiconductor composite of FIG. 2 after steps of applying a photoresist and etching to form vias.

FIG. 3 shows the composite 1 after an optional planarizing layer 11 (such as $SiO_2$, SiN or SiON) is provided on the silicon oxide/nitride layer 3. In addition, FIG. 3 shows a photoresist layer 12 provided on the planarized layer 11, 3 and vias 13 extending through the photoresist layer 12, the planarizing layer 11 and the silicon oxide/nitride layer 3. As an example, the short via could be 5000 Å deep and the longer via could be 2½ μm deep. As can be appreciated from FIG. 3, the region of the electrically conductive layer 2 on the right side of FIG. 3 will be exposed to the etching gas for a longer time than the region of the electrically conductive layer 2 shown on the left side of FIG. 3. In order to fully remove the silicon oxide/nitride layer 3, both regions of the electrically conductive layer 2 can be overetched during the etching process such as by at least 200% or even at least 350%.

The silicon oxide/nitride layer 3 can comprise a silicon dioxide layer, a silicon nitride layer or a layer of oxynitride. The electrically conductive layer 2 can comprise a metal-containing layer such as Al, Al alloys, Ti, TiN, TiW and Mo. The remaining layers of the composite 1 can comprise conventional materials and the composite 1 can take other forms than that shown in FIGS. 1–3. That is, the embodiment of the composite 1 shown in FIGS. 1–3 is merely for purposes of illustrating how the inventive method can be used to provide vias in a semiconductor composite.

The etching in accordance with the invention can comprise reactive ion etching typically carried out at pressures of 50 mTorr or less or plasma etching typically carried out at pressures above those used for reactive ion etching. In either case, the etching gas is in an ionized state when it contacts the semiconductor surface being etched. The etching gas includes a fluoride-containing gas and the passivating gas. The fluoride-containing gas can comprise $CF_4$, $CHF_3$, $C_2F_6$, $CH_2F_2$, $SF_6$ or other Freons and mixtures thereof. The etching gas can also include a carrier gas such as Ar, He, Ne, Kr or mixtures thereof. The etching gas can be exposed to a microwave electric field and/or a magnetic field during the etching step.

The flow rates of the various constituents of the etching gas are controlled to provide suitable etching while suppressing sputtering of the electrically conductive layer 2. For instance, the flow rate of the nitrogen can be at least 10 sccm and the flow rate of the fluoride-containing gas can be 4 to 100 sccm. The amount of nitrogen added to the etch gas should be enough to suppress sputtering of the electrically conductive layer. Although there is no upper limit on the amount of nitrogen which can be added to the gas due to the highly reactive nature of the nitrogen with components of the etching apparatus, the maximum amount of nitrogen should be controlled to prevent the equipment from wearing out. The carrier gas is optional. For instance, if argon is the carrier gas, it can be added in any amount such as 1 l/min (1000 sccm). In a typical via etching process, the oxide can be etched through in about one minute and overetching of 350% can be performed in about three minutes. In accordance with the invention, by adding nitrogen to the etching gas, it is possible to totally prevent sputtering or redeposition of Al, Ti or TiN underlying electrically conducting layers during the oxide etch.

The process of the invention can also include steps of forming a photoresist layer on the silicon oxide/nitride layer and patterning the photoresist layer to form a plurality of via holes therein. The etching step forms vias in the silicon oxide/nitride layer corresponding to the via holes in the photoresist layer. Also, the process of the invention can include a step of planarizing the silicon oxide/nitride layer prior to the etching step. In this case, the silicon oxide/nitride layer can be etched and/or covered with a photoresist or spin-on glass to achieve planarization. Furthermore, the process of the invention can include a step of depositing a multi-level electrically conductive layer so as to provide first and second regions thereof which are spaced apart and at different levels. At this case, the planarizing step decreases thicknesses of the silicon oxide/nitride layer such that the silicon oxide/nitride layer is thicker above the first region than above the second region, as shown in FIGS. 2 and 3. The process can also include a step of depositing metal on the composite after the etching step so as to fill the vias with metal.

While the invention has been described with reference to the foregoing embodiments, various changes and modifications can be made thereto which fall within the scope of the following claims.

What is claimed is:

1. A process for etching a layer of silicon oxide or silicon nitride or combination thereof, comprising the steps of:
   providing a semiconductor composite comprising an electrically conductive layer underlying a layer of silicon oxide or silicon nitride or combination thereof; and
   etching the layer of silicon oxide or silicon nitride or combination thereof to expose the electrically conductive layer and provide a via extending through the layer of silicon oxide or silicon nitride or combination thereof to the electrically conductive layer, the etching being performed by exposing the layer of silicon oxide or silicon nitride or combination thereof to an etching gas in an ionized state in a reaction chamber of a plasma generating device, the etching gas including a fluoride-containing gas and a passivating gas, the passivating gas comprising nitrogen which is present in an amount effective to suppress sputtering of the electrically conductive layer when it is exposed to the etching gas during the etching step.

2. The process of claim 1, wherein the layer of silicon oxide or silicon nitride or combination thereof comprises a silicon dioxide layer.

3. The process of claim 1, wherein the etching step comprises reactive ion etching.

4. The process of claim 1, wherein the etching step comprises plasma etching.

5. The process of claim 1, wherein the etching gas consists essentially of the fluoride-containing gas and the nitrogen gas.

6. The process of claim 1, wherein the electrically conductive layer comprises a metal-containing layer selected from the group consisting of Al, Al alloys, Ti, TiN, TiW and Mo.

7. The process of claim 1, wherein the layer of silicon oxide or silicon nitride or combination thereof comprises a layer of oxynitride.

8. The process of claim 1, wherein the fluoride-containing gas comprises a gas selected from the group consisting of $CF_4$, $CHF_3$, $CH_3F$, $C_2F_6$, $CH_2F_2$, $SF_6$, $C_nF_{n+4}$ and mixtures thereof.

9. The process of claim 1, wherein the etching gas includes a carrier gas selected from the group consisting of Ar, He, Ne, Kr or mixtures thereof.

10. The process of claim 1, wherein the etching gas is exposed to a microwave electric field during the etching step.

11. The process of claim 1, wherein the etching gas is exposed to a magnetic field during the etching step.

12. The process of claim 1, wherein the etching gas is exposed to a microwave electric field and a magnetic field during the etching step.

13. The process of claim 1, wherein the passivating gas comprises $N_2$ and during the etching step a flow rate of the $N_2$ is at least 10 sccm and a flow rate of the fluoride-containing gas is 4 to 100 sccm.

14. The process of claim 1, further comprising depositing metal on the composite after the etching step so as to fill the via with metal.

15. The process of claim 1, wherein the etching step is carried out until at least 200% over etching is achieved.

16. The process of claim 1, further comprising steps of forming a photoresist layer on the layer of silicon oxide or silicon nitride or combination thereof, patterning the photoresist layer to form a plurality of via holes therein and the etching step forms vias in the layer of silicon oxide or silicon nitride or combination thereof corresponding to the via holes in the photoresist layer.

17. The process of claim 1, further comprising a step of planarizing the layer of silicon oxide or silicon nitride or combination thereof prior to the etching step.

18. The process of claim 16, further comprising a step of planarizing the layer of silicon oxide or silicon nitride or combination thereof prior to the etching step.

19. The process of claim 18, further comprising a step of depositing the electrically conductive layer so as to provide first and second regions thereof which are spaced apart and at different levels, the planarizing step decreasing thicknesses of the layer of silicon oxide or silicon nitride or combination thereof such that the layer of silicon oxide or silicon nitride or combination thereof is thicker above the first region than above the second region.

* * * * *